United States Patent
Hu et al.

(10) Patent No.: US 12,513,854 B2
(45) Date of Patent: Dec. 30, 2025

(54) THERMAL PAD SERVICE KIT

(71) Applicant: DELL PRODUCTS L.P., Round Rock, TX (US)

(72) Inventors: Shih-Hsuan Hu, New Taipei (TW); Chi-Chang Fu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 241 days.

(21) Appl. No.: 18/496,711

(22) Filed: Oct. 27, 2023

(65) Prior Publication Data
US 2025/0142770 A1    May 1, 2025

(51) Int. Cl.
*H05K 7/20* (2006.01)
*H05K 1/11* (2006.01)

(52) U.S. Cl.
CPC ......... *H05K 7/20254* (2013.01); *H05K 1/111* (2013.01)

(58) Field of Classification Search
CPC ................................................. H05K 7/20254

USPC ......................................................... 361/767
See application file for complete search history.

(56) References Cited

U.S. PATENT DOCUMENTS

| 10,971,427 | B2 | 4/2021 | He et al. |
| 11,460,895 | B2 | 10/2022 | Hobbs et al. |
| 2023/0143361 | A1 | 5/2023 | Taur et al. |

FOREIGN PATENT DOCUMENTS

CN    202120149511    * 11/2021

* cited by examiner

*Primary Examiner* — Stanley Tso
(74) *Attorney, Agent, or Firm* — Larson Newman, LLP

(57) ABSTRACT

A thermal pad service kit includes a package having a first clamshell and a second clamshell. A thermal pad is enclosed between the first clamshell and the second clamshell, and a first side of the thermal pad is removably coupled to the first clamshell via an adhesive film. A second side of the thermal pad is tacky and removably coupled to a non-adhesive film. The second side of the thermal pad is coupled to a surface of a component after removing the non-adhesive film from the second side of the thermal pad and laying the thermal pads on the surface of the component.

20 Claims, 4 Drawing Sheets

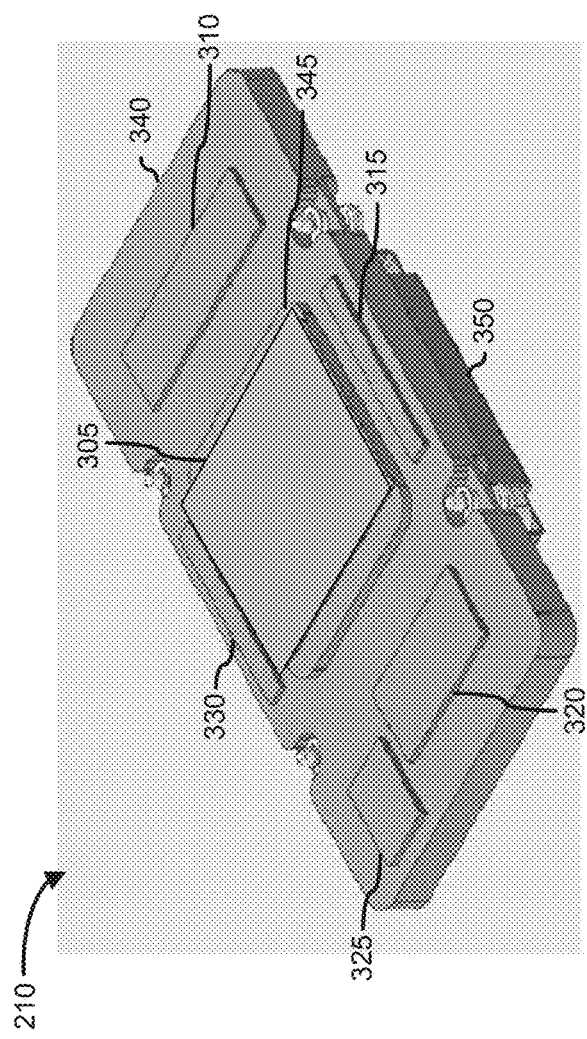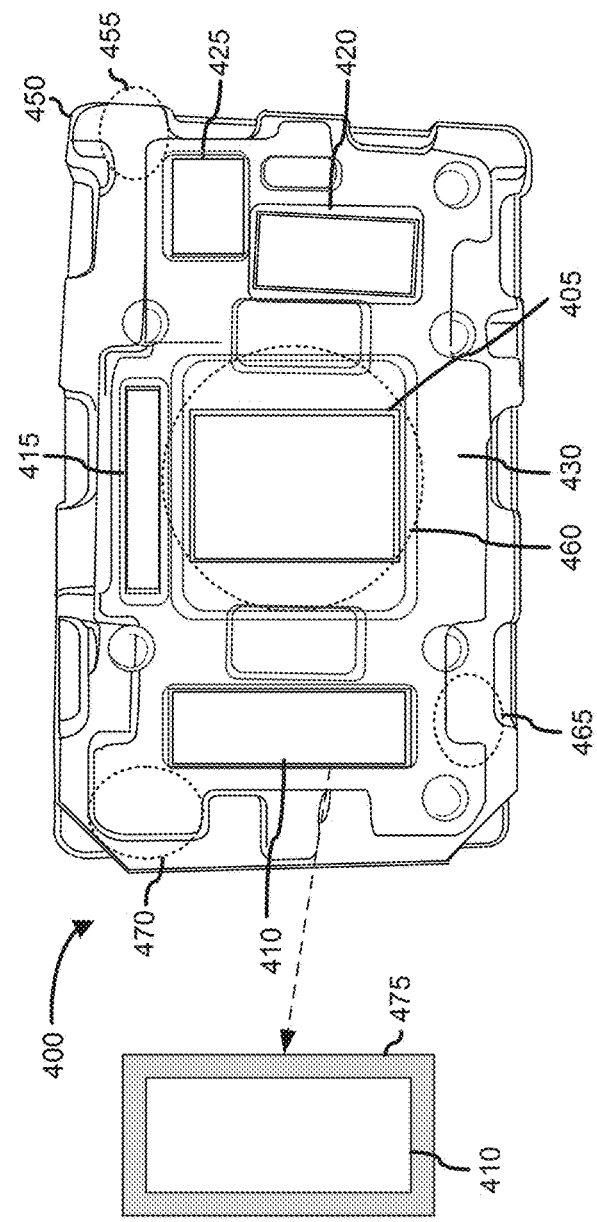

THERMAL PAD SERVICE KIT

FIELD OF THE DISCLOSURE

The present disclosure generally relates to information handling systems, and more particularly relates to thermal pad service kits.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A thermal pad service kit includes a package having a first clamshell and a second clamshell. A thermal pad is enclosed between the first clamshell and the second clamshell, and a first side of the thermal pad is removably coupled to the first clamshell via an adhesive film. A second side of the thermal pad is tacky and removably coupled to a non-adhesive film. The second side of the thermal pad is coupled to a surface of a component after removing the non-adhesive film from the second side of the thermal pad and laying the thermal pads on the surface of the component.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 3 is a perspective view of a cold plate, according to an embodiment of the present disclosure;

FIG. 4 is a diagram of a thermal pad service kit for servicing a non-uniform heatsink or cold plate.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
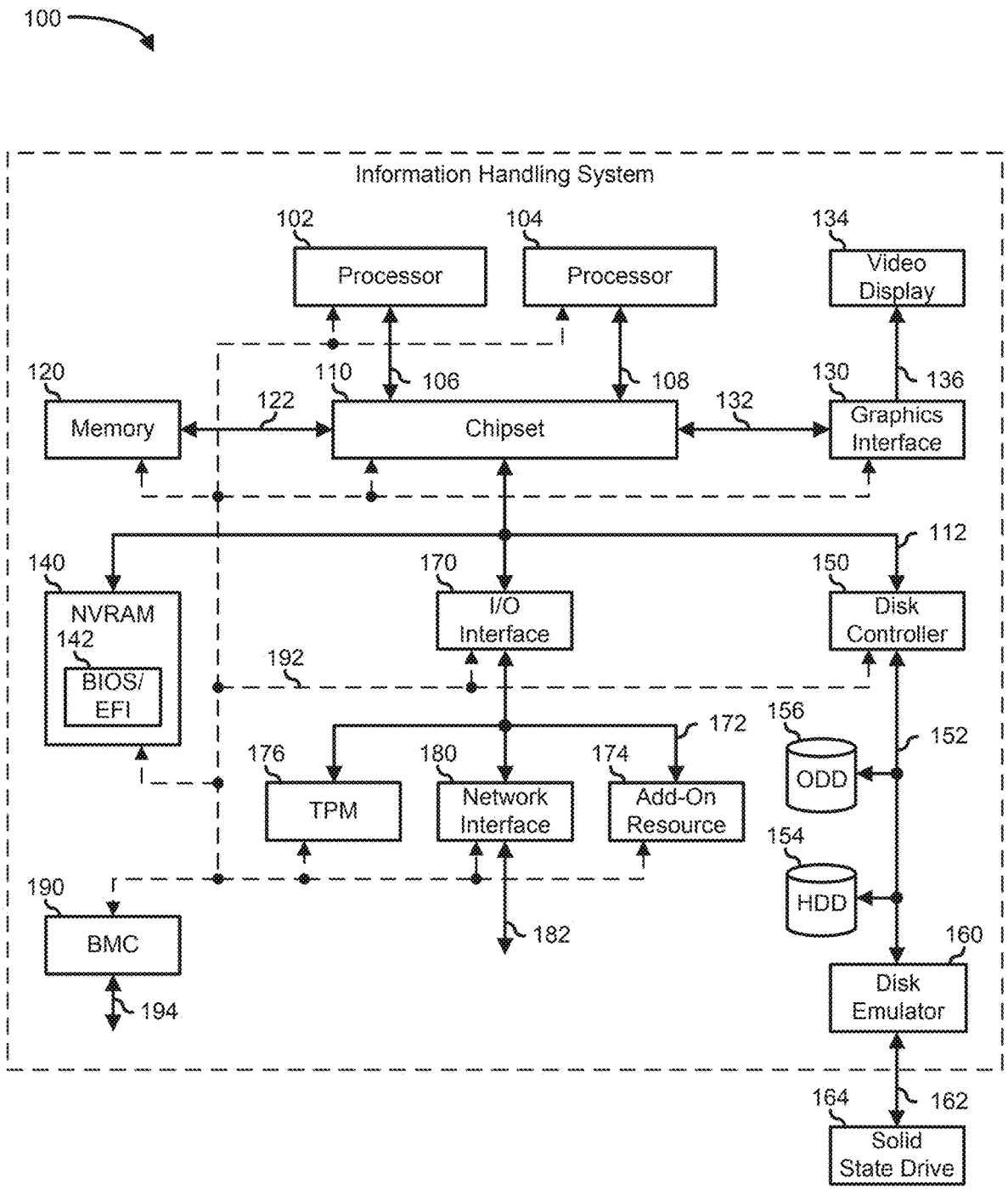
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four-lane (x4) PCIe adapter, an eight-lane (x8) PCIe adapter, a 16-lane (x16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including a PCIe interface, an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board, or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device, a BMC may be referred to as an embedded controller (EC). A BMC included in a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include a I2C bus, a System Management Bus (SMBus), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor defined interfaces (such as a Dell EMC Remote Access Controller Administrator (RACADM) utility, a Dell EMC OpenManage Enterprise, a Dell EMC OpenManage Server Administrator (OMSA) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC, or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purposes of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

In modern graphics processing unit (GPU) design, a GPU module includes several components, such as a GPU die, power module, or memory. Each component and area of the GPU may have different heating or cooling requirements which may need different thermal pad dimensions and/or materials. Similarly, a CPU may also have different heating or cooling requirements. Accordingly, the CPU may also have different thermal pad dimensions and material requirements. As such, a service engineer may need to determine thermal pad requirements and source thermal pads of varying materials and dimensions to replace current thermal pads used in a heat sink or a cold plate for cooling the GPU or the CPU. This is inefficient, and thus there is a need for a thermal pad service kit that includes thermal pads with the required dimensions and materials for a particular heat sink or cold plate. For example a first thermal pad service kit may be used for a heat sink model, while a second thermal pad service kit may be used for another heat sink model. Accordingly, the service engineer may determine the thermal pad service kit appropriate for the heat sink or cold plate being serviced.

Figure 2:
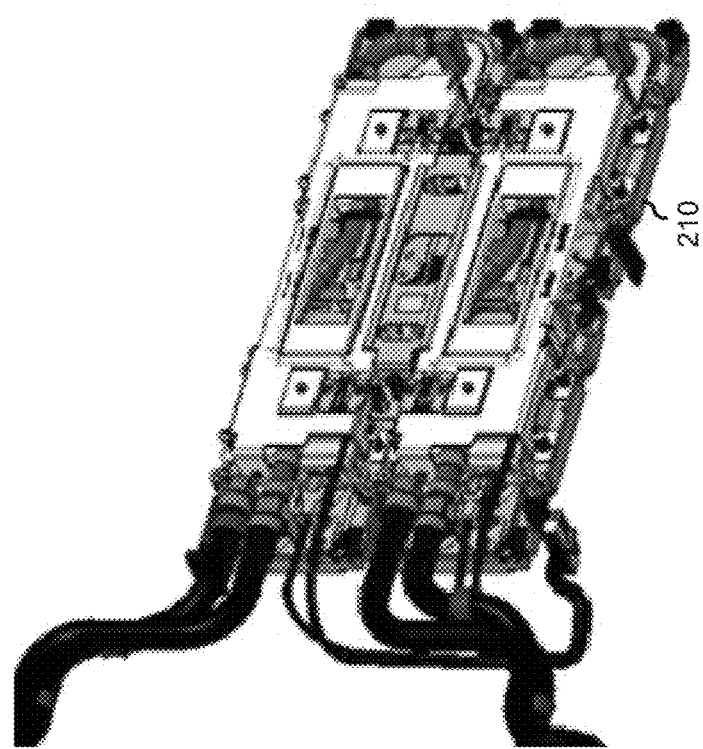
FIG. 2 is a perspective view of a graphics processing unit with a cold plate, according to an embodiment of the present disclosure.

FIG. 2 shows a perspective view of a GPU 200 with a cold plate 210. In this example, GPU 200 is cooled by cold plate 210 which can be a GPU-mounted liquid cold plate. When servicing cold plate 210, a service technician may disconnect cold plate 210 from GPU 200 to have access to the thermal pads being replaced.

FIG. 3 shows a perspective view of cold plate 210 which has been disconnected from GPU 200. Cold plate includes a first surface 340 and a second surface 345 which may be elevated to accommodate a support bracket 350. First surface 340 and second surface 345 may both be made from copper alloy or similar material. Cold plate 210 includes thermal pads 305, 310, 315, 320, 325, and 330, wherein the thermal pads are physically coupled to the surfaces of cold plate 210. For example, because a thermal pad may be tacky on one side, it can adhere to a surface of cold plate 210. In another example, each thermal pad may be coupled to the surface of cold plate 210 via an adhesive, a glue, or the like. Thermal pads 305, 310, 315, 320, 325, and 330 may be or include a thermally conductive pad comprised of a soft or malleable matter, such as paraffin wax, silicon rubber, or the like, and wherein the material may be infused with metal particles. The thermal pads may be operable to aid in the conduction of heat away from GPU 200. Thermal pads 305, 310, 315, 320, 325, and 330 may be in one of various geometric shapes, such as a square, circular, rectangular, or the like.

In one embodiment, the thermal pads may be used to occupy, or fill, one or more air gaps caused by deviations between cold plate 210 and a component of GPU 200. As shown, the thermal pads 305, 310, 315, 320, 325, and 330 may have different dimensions and/or thicknesses according to the requirements of cold plate 210 and/or a proximate component. For example, a big gap between cold plate 210 and a first component may require a thick thermal pad while a small gap between cold plate 210 and a second component may require a thin thermal pad. In one embodiment, thermal pads 305, 310, 315, 320, 325, and 330 may be soft, or malleable at room temperature such that the structural integrity of the thermal pads may be compromised when installed, uninstalled, or otherwise handled by a user. Thermal pads 305, 310, 315, 320, 325, and 330 may also degrade with time causing the temperature of GPU 200 to increase. Accordingly, at some point thermal pads 305, 310, 315, 320, 325, and 330 may be replaced.

FIG. 4 shows a thermal pad service kit 400 for servicing a non-uniform GPU/CPU heatsink or cold plate. Thermal pad service kit 400, also referred to simply as a service kit 400 includes pre-cut thermal pads 405, 410, 415, 420, and 425 of various shapes and sizes enclosed within a package 450. In this example, thermal pads 405, 410, 415, 420, and 425 may be used to replace thermal pads 305, 310, 315, 320, 325, and 330, respectively. Accordingly, thermal pads 405, 410, 415, 420, and 425 may also be referred to as replacement thermal pads. The material, thickness, and other dimensions of thermal pads 405, 410, 415, 420, and 425 may match the material, thickness, and other dimensions of thermal pads 305, 310, 315, 320, 325, and 330, respectively. For example, thermal pads 405, 410, 415, 420, and 425 may be pre-cut to different lengths and widths to match the lengths and widths of thermal pads 305, 310, 315, 320, 325, and 330, respectively. Accordingly, thermal pad 405 is similar to thermal pad 305, thermal pad 410 is similar to thermal pad 310, thermal pad 415 is similar to thermal pad 315, thermal pad 420 is similar to thermal pad 320, thermal pad 425 is similar to thermal pad 325, and thermal pad 430 is similar to thermal pad 330.

Using service kit 400 with pre-cut thermal pads may speed up the service process without the mess associated with thermal greases or pastes. In addition, thermal pads 405, 410, 415, 420, and 425 in service kit 400 have been chosen and pre-cut for a particular component, such as a specific model of a heatsink or a cold plate, for the convenience of the service technician in applying new thermal pads or replacing the thermal pads of the component. Thus, the service technician may not have to determine the dimensions, materials, and other considerations when applying or replacing a thermal pad for that particular component.

Packaging 450 may be configured to accommodate thermal pads 405, 410, 415, 420, 425, and 430 and/or other components. For example, packaging 450 may be configured or molded with one or more areas to receive corresponding thermal pads. These areas are also molded according to the contours and/or shape of the particular component that the thermal pads would be applied to. In addition, packaging 450 may also be configured or molded to include guide features 455, 460, 465, and 470. The guide features may be used to align service kit 400 with the first surface and the second surface of cold plate 210, such that thermal pads 405, 410, 415, 420, 425, and 430 may be placed in the correct areas or locations on cold plate 210.

In addition, packaging 450 may be clear or transparent, such that thermal pads 405, 410, 415, 420, 425, and 430 can be seen easily by a user. Thus, packaging 405 may be made of a synthetic resin material, such as polyethylene terephthalate, vinyl chloride, or polystyrene. Packaging 450 may be a clamshell package and can include a first clamshell and a second clamshell and engage to close the package, securing the thermal pads within. Accordingly, packaging 450 may configured as a single module to be easier for the service technician to grasp. In addition, packaging 450 may be sealed for easier transport. However, the first clamshell and the second clamshell can be separated by pulling the clamshells apart. The first clamshell or the second clamshell may also function as a service tray when servicing the thermal pads of cold plate 210.

A first side of each thermal pad may be removably coupled or removably adhered to a first clamshell, such as via an adhesive film. For example, thermal pad 410 is adhered to the first clamshell via an adhesive film 475. Accordingly, thermal pads 405, 415, 420, 425, and 430 may also be removably coupled to the first clamshell via adhesive films. A second side of each thermal pad may be tacky and may be removably coupled to a non-adhesive film. This prevents the thermal pad from adhering to the second clamshell. The first clamshell and the second clamshell may be securely closed together keeping thermal pads 405, 410, 415, 420, 425, and 430 enclosed between the two clamshells. Although packaging 450 is shown as a rectangle, one of skill in the art will appreciate that the package disclosed herein may be of a different shape and size.

Figure 5:
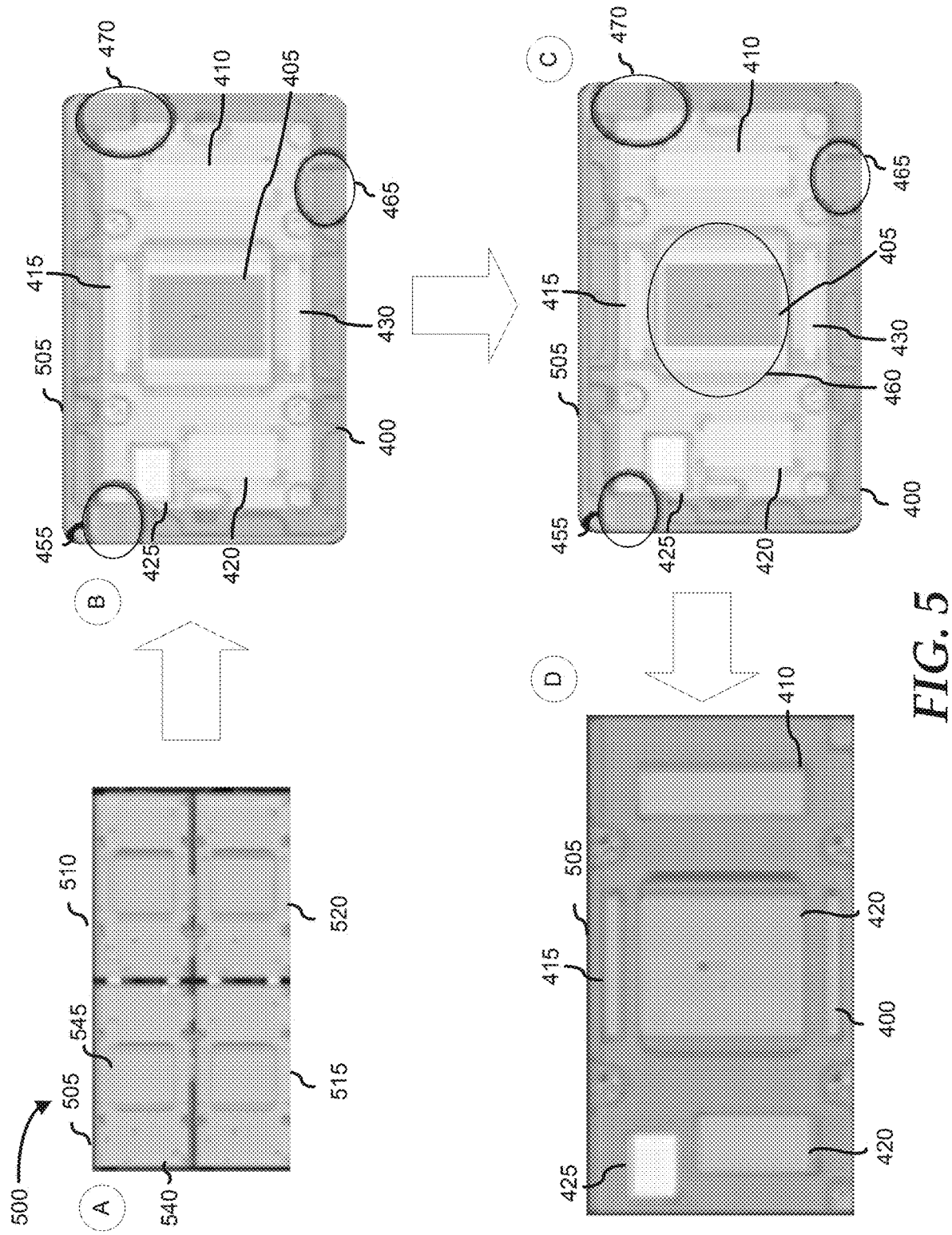
FIG. 5 is a flowchart of a method for servicing a non-uniform cold plate, according to an embodiment of the present disclosure.

FIG. 5 shows a flowchart of a method 500 for servicing a non-uniform GPU cold plate. FIG. 5 is annotated with a series of letters A, B, C, and D. Each of these letters represents a stage of one or more operations. Although these stages are ordered for this example, the stages illustrate one example to aid in understanding this disclosure and should not be used to limit the claims. Subject matter falling within the scope of the claims can vary with respect to the order of the operations. Further, although examples here are shown servicing thermal pads of a cold plate, one of skill in the art will appreciate that the present disclosure may apply to servicing a heat sink or other components of an information handling system wherein a thermal pad may be used. For example, using the service kit the thermal pads may be used to install or replace thermal pads on a CPU, a time-division multiplexed power chip, an SSD controller, or any component that can benefit from dissipating heat.

At stage A, a service technician may have disconnected cold plates 505, 510, 515, and 520 from a GPU. In addition, the service technician may have prepared the cold plates for the application of the thermal pads. The preparation may include cleaning the surfaces of the cold plates to allow the thermal pad to adhere to the surfaces, such as by using alcohol or the like. In this example, cold plates 505, 510, 515, and 520 are similar to cold plate 210. As such, cold plate 505 includes a first surface 540 and a second surface 545 which are similar to first surface 340 and second surface 345 respectively.

At stage B, the service technician may have placed service kit 400 on top of a surface of cold plate 505 using guide features 455, 465, and 470 as guides in aligning service kit 400 to first surface 540 of cold plate 505 to a correct position. Thus, laying the thermal pads 405, 410, 415, 420, 425, and 430 at their designated locations in a fool-proof manner. Prior to placing service kit 400 on top of the surface of cold plate 505, the service technician may have pulled the clamshells apart and peeled off the non-adhesive film from the second side of each of thermal pads 405, 410, 415, 420, 425, and 430, exposing the adhesive on the second side of the thermal pads. This allows the thermal pads to adhere to the surfaces of cold plate 505.

At stage C, the service technician may also use guide feature 460 as a guide to align the molded section of service kit 400 over elevated second surface 545 of cold plate 505. Thus, laying the second side of thermal pad 405 at its designated location in a fool-proof manner. At this point, the service technician may push or apply pressure to thermal pads 405, 410, 415, 420, 425, and 430. Thus, physically coupling or adhering thermal pads 410, 415, 420, 425, and 430 to the first surface of cold plate 210 and thermal pad 405 to the second surface of cold plate 210.

At stage D, after ensuring that thermal pads 405, 410, 415, 420, 425, and 430 are coupled or adhered to first surface 540 and second surface 545, the service technician may lift off the clamshell of packaging 450 from cold plate 505 uncoupling thermal pads 405, 410, 415, 420, 425, and 430 from the adhesive films and leaving thermal pads 405, 410, 415, 420, 425, and 430 on first surface 540 and second surface 545 of cold plate 505. The adhesive films may remain coupled with the first clamshell.

Those of ordinary skill in the art will appreciate that the configuration, hardware, and/or software components of service kit 400 depicted in FIG. 4 may vary. For example, the illustrative components of service kit 400 are not intended to be exhaustive but rather are representative to highlight components that can be utilized to implement aspects of the present disclosure. For example, other components may be used in addition to or in place of the components depicted. The depicted example does not convey or imply any limitations with respect to the presently described embodiments and/or the general disclosure. In the discussion of the figures, reference may also be made to components illustrated in other figures for continuity of the description.

It should be noted that although embodiments herein may be described within the context of a cold plate mounted in a GPU and a service pack in clamshell package, aspects of the present disclosure are not so limited. A person of skill in the art will appreciate that the teachings described herein are applicable to other components, such as a heatsink, a CPU, a motherboard, a network interface card, an SSD, etc. may benefit from using the teachings described herein. In addition, the package may be made of a single molded component instead of two clamshells. Accordingly, the aspects of the present disclosure may be applied or adapted for use in many other contexts.

Although FIG. 5 shows example stages of method 500 in some implementation, method 500 may include additional stages, fewer stages, various stages, or differently arranged stages than those depicted in FIG. 5. Those skilled in the art will understand that the principles presented herein may be implemented in any suitably arranged processing system. Additionally, or alternatively, two or more of the blocks of method 500 may be performed in parallel. For example, stage B and stage C of method 500 may be performed in parallel.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes, or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A thermal pad service kit comprising:
 a package including a first clamshell and a second clamshell; and
 a thermal pad enclosed between the first clamshell and the second clamshell, wherein a first side of the thermal pad is removably coupled to the first clamshell via an adhesive film, wherein a second side of the thermal pad is tacky and removably coupled to a non-adhesive film, and wherein the second side of the thermal pad is coupled to a surface of a component after removing the non-adhesive film from the second side of the thermal pad and laying the thermal pads on the surface of the component.

2. The thermal pad service kit of claim 1, wherein the thermal pad is pre-cut to a length and width.

3. The thermal pad service kit of claim 1, wherein the thermal pad is of a particular thickness.

4. The thermal pad service kit of claim 1, wherein the package is molded to conform to the surface of the component.

5. The thermal pad service kit of claim 1, wherein the package is molded to conform to a first surface and a second surface of the component.

6. The thermal pad service kit of claim 1, wherein the component is a cold plate.

7. The thermal pad service kit of claim 1, wherein the component is a heatsink.

8. The thermal pad service kit of claim 1, wherein the package includes guide features to place the thermal pad to a location on the surface of the component.

9. A thermal pad service kit comprising:
   a clear package; and
   a thermal pad enclosed in the clear package, wherein a first side of the thermal pad is removably coupled to a first surface of the clear package via an adhesive film, wherein a second side of the thermal pad is tacky and removably coupled to a non-adhesive film, and wherein the second side of the thermal pad is coupled to a surface of a component after removing the non-adhesive film from the second side of the thermal pad and laying the thermal pads on the surface of the component.

10. The thermal pad service kit of claim 9, wherein the thermal pad is pre-cut to a length and width.

11. The thermal pad service kit of claim 9, wherein the thermal pad is of a particular thickness.

12. The thermal pad service kit of claim 9, wherein the clear package is molded to conform to a surface of the component.

13. The thermal pad service kit of claim 9, wherein the clear package is molded to conform to the first surface and a second surface of the component.

14. The thermal pad service kit of claim 9, wherein the clear package includes guide features to place the thermal pad to a location on the surface of the component.

15. A thermal pad service kit for replacing a thermal pad on a component of an information handling system, the thermal pad service kit comprising:
   packaging molded to align with a surface of the component of the information handling system; and
   a replacement thermal pad to replace the thermal pad, wherein a first side of the replacement thermal pad is removably coupled to the packaging via an adhesive film, a second side of the replacement thermal pad is tacky and removably coupled to a non-adhesive film, and the second side of the replacement thermal pad is manually coupled to the surface of the component after removing the non-adhesive film from the second side of the replacement thermal pad and aligning the packaging with the surface of the component of the information handling system.

16. The thermal pad service kit of claim 15, wherein the replacement thermal pad is pre-cut to a length and width as the thermal pad.

17. The thermal pad service kit of claim 15, wherein the thermal pad is of a particular thickness as the thermal pad.

18. The thermal pad service kit of claim 15, wherein the packaging is molded to conform to the surface of the component.

19. The thermal pad service kit of claim 15, wherein the packaging includes a guide feature.

20. The thermal pad service kit of claim 19, wherein the guide feature is configured to place the replacement thermal pad to a location on the surface of the component.

* * * * *